US012199008B2

(12) United States Patent
Williamson et al.

(10) Patent No.: US 12,199,008 B2
(45) Date of Patent: Jan. 14, 2025

(54) PACKAGE HEAT DISSIPATION INCLUDING A DIE ATTACH FILM

(71) Applicant: TEXAS INSTRUMENTS INCORPORATED, Dallas, TX (US)

(72) Inventors: Jaimal Mallory Williamson, McKinney, TX (US); Rongwei Zhang, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/219,602

(22) Filed: Mar. 31, 2021

(65) Prior Publication Data

US 2022/0319954 A1 Oct. 6, 2022

(51) Int. Cl.
*H01L 23/373* (2006.01)
*H01L 23/00* (2006.01)
*H01L 23/31* (2006.01)

(52) U.S. Cl.
CPC ...... *H01L 23/3737* (2013.01); *H01L 23/3128* (2013.01); *H01L 23/3736* (2013.01); *H01L 24/16* (2013.01); *H01L 2224/16225* (2013.01)

(58) Field of Classification Search
CPC ... H01L 23/36; H01L 23/367; H01L 23/3672; H01L 23/373; H01L 23/3737; H01L 23/3128; H01L 25/50; H01L 25/105; H01L 2224/26; H01L 2224/32221; H01L 2224/83855; H01L 2224/28105; H01L 21/4871; H01L 21/4882; H01L 23/3107; H01L 23/42; H01L 23/49811
USPC .......................................................... 257/738
See application file for complete search history.

(56) References Cited

U.S. PATENT DOCUMENTS 5,883,430 A * 3/1999 Johnson .............. H01L 23/3128 257/796
6,946,205 B2 * 9/2005 Higashitani .......... H05K 3/4617 428/609
8,766,440 B2 * 7/2014 Kikuchi .................. H01L 24/20 257/659
9,041,192 B2 * 5/2015 Saeidi ..................... H01L 23/42 257/710
9,230,874 B1 * 1/2016 Li ........................ H01L 23/3675
9,985,005 B2 * 5/2018 Meyer ................. H01L 23/3107
10,043,924 B1 * 8/2018 Kaufmann ........ H01L 31/02327
10,541,156 B1 * 1/2020 Interrante ........... H01L 23/3675
10,770,405 B2 * 9/2020 Huang ................ H01L 25/0655
(Continued)

FOREIGN PATENT DOCUMENTS

CN 111944224 A * 11/2020 ............. B05D 3/002
JP 2005008774 A * 1/2005 ................ C09J 7/00

*Primary Examiner* — Khiem D Nguyen
(74) *Attorney, Agent, or Firm* — Dawn Jos; Frank D. Cimino

(57) ABSTRACT

In examples, a semiconductor package comprises a substrate including a conductive layer; a conductive pillar coupled to the conductive layer; and a semiconductor die having first and second opposing surfaces. The first surface is coupled to the conductive pillar. The package also includes a die attach film abutting the second surface of the semiconductor die and a metal layer abutting the die attach film and having a metal layer surface facing away from the die attach film. The metal layer surface is exposed to an exterior of the FCCSP. The package includes a mold compound layer covering the substrate.

11 Claims, 13 Drawing Sheets

(56) References Cited

U.S. PATENT DOCUMENTS

2003/0049883 A1* 3/2003 Yajima ................ H01L 21/6836 438/106
2006/0157223 A1* 7/2006 Gelorme ................ H01L 23/42 165/185
2010/0001410 A1* 1/2010 Kang ...................... H01L 23/42 257/E23.141
2010/0148326 A1* 6/2010 Mohammad ............ H01L 24/31 438/122
2012/0313243 A1* 12/2012 Chang ..................... H01L 24/19 257/737
2013/0241044 A1* 9/2013 Kim .................... H01L 23/4334 257/E23.18
2014/0008777 A1* 1/2014 Loh ......................... H01L 24/97 257/676
2015/0235915 A1* 8/2015 Liang .................. H01L 25/0652 361/764
2015/0235993 A1* 8/2015 Cheng ................. H01L 23/5389 438/107
2016/0056087 A1* 2/2016 Wu ....................... H01L 25/105 257/738
2016/0071829 A1* 3/2016 Yu ........................... H01L 23/50 257/773
2016/0079190 A1* 3/2016 Yu ........................... H01L 24/19 257/738
2017/0338177 A1* 11/2017 Lin ..................... H01L 21/4853
2018/0337160 A1* 11/2018 Drab ..................... H01L 21/561
2018/0358288 A1* 12/2018 Lee ......................... H01L 24/20
2019/0164907 A1* 5/2019 Chen ................. H01L 23/49827
2019/0330051 A1* 10/2019 Karhade ............. H01L 23/4334
2020/0176345 A1* 6/2020 Oh .......................... H01L 23/42
2020/0185330 A1* 6/2020 Yu ........................... H01L 24/92
2020/0312771 A1* 10/2020 Nie ......................... H01L 24/19
2021/0050459 A1* 2/2021 Kummerl ................ H01L 24/48
2021/0066265 A1* 3/2021 Eid .......................... H01G 2/06

* cited by examiner

PACKAGE HEAT DISSIPATION INCLUDING A DIE ATTACH FILM

BACKGROUND

Semiconductor chips are housed inside semiconductor packages that protect the chips from deleterious environmental influences, such as heat, moisture, and debris. A packaged chip communicates with electronic devices outside the package via conductive terminals, such as leads, that are exposed to surfaces of the package. Within the package, the chip may be electrically coupled to the conductive terminals using any suitable technique. One such technique is the flip-chip technique, in which the semiconductor chip (also called a "die") is flipped so the device side of the chip is facing downward. The device side is coupled to the conductive terminals using, e.g., solder bumps.

SUMMARY

In examples, a semiconductor package comprises a substrate including a conductive layer; a conductive pillar coupled to the conductive layer; and a semiconductor die having first and second opposing surfaces. The first surface is coupled to the conductive pillar. The package also includes a die attach film abutting the second surface of the semiconductor die and a metal layer abutting the die attach film and having a metal layer surface facing away from the die attach film. The metal layer surface is exposed to an exterior of the FCCSP. The package includes a mold compound layer covering the substrate.

BRIEF DESCRIPTION OF THE DRAWINGS

For a detailed description of various examples, reference will now be made to the accompanying drawings in which.

DETAILED DESCRIPTION

Semiconductor packages can generate substantial amounts of heat during operation. A package may be designed to expel such heat to maintain the structural and functional integrity of the components within the package. In some flip-chip packages, a metal lid is coupled to the non-device side (back side) of the die. The metal lid expels heat from within the package, but it also adds substantial bulk to the package and adds considerable manufacturing expense, as well.

This disclosure describes various examples of a semiconductor package, such as a flip-chip chip scale package (FCCSP), that includes a die attach film or a polymerized and cured thermally conductive paste coupled to the non-device side of the semiconductor die. In some examples, the die attach film (or thermally conductive paste) is exposed to an exterior of the FCCSP. In other examples, the die attach film (or thermally conductive paste) is coupled to a metal layer that includes an anti-corrosive passivation layer or plating layer and that is exposed to an exterior of the FCCSP. In some examples, a surface of the die attach film, thermally conductive paste, or metal layer that opposes the semiconductor die is approximately horizontally co-planar with an outer surface of a mold compound layer that covers the FCCSP. Because such FCCSPs lack the metal lids present in conventional FCCSPs, they are less bulky and less expensive to manufacture than conventional FCCSPs. Further, eliminating the lid assembly and curing process reduces manufacturing time by three hours or more, thus substantially increasing manufacturing throughput. Various example structures of such FCCSPs, as well as methods that facilitate the manufacture of such FCCSPs, are now described with reference to the drawings. Although the examples below are described in the context of FCCSPs, the techniques described herein also may be applied to other types of semiconductor packages.

Figure 1A:
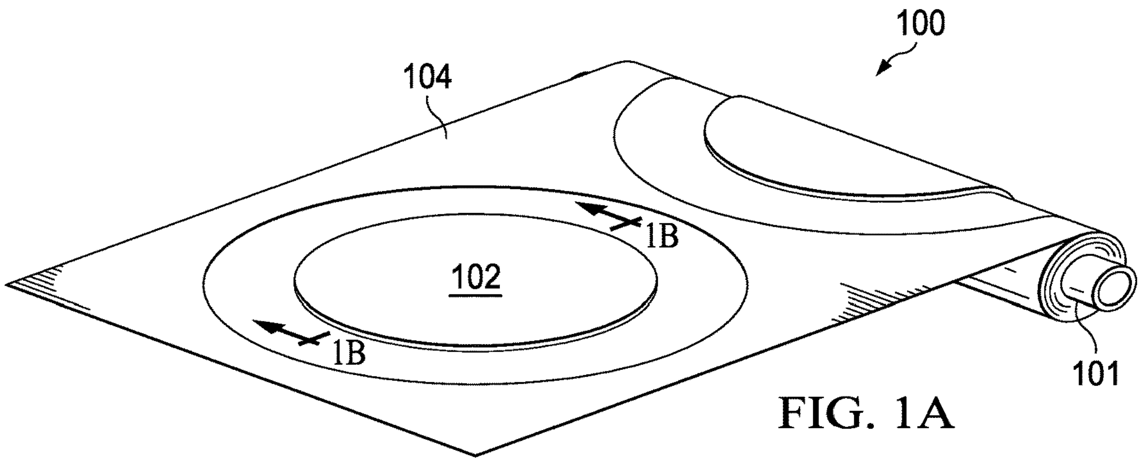
FIG. 1A is a perspective view of a die attach film and metal layer combination roll, in accordance with various examples.

FIG. 1A is a perspective view of a die attach film and metal layer combination roll 100, in accordance with various examples. The roll 100 includes a sheet 104 axially wound around a cylindrical member 101. The sheet 104 includes a die attach film and metal layer combination 102. As described below, the combination 102 is useful to facilitate the manufacture of a FCCSP in accordance with various examples. In examples, the combination 102 is circular in the horizontal plane and has a diameter approximately matching the diameter of a semiconductor (e.g., silicon) wafer on which the combination 102 is to be applied. An exposed surface of the combination 102 may be suitably adhesive to facilitate application and coupling to a semiconductor wafer.

Figure 1B:
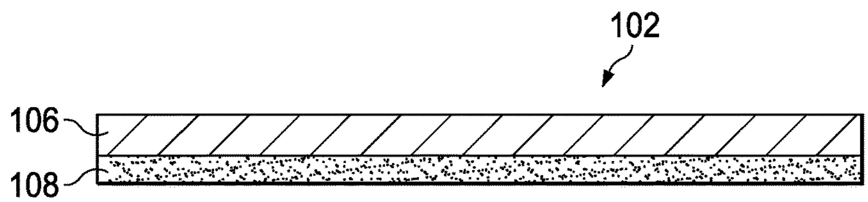
FIG. 1B is a cross-sectional view of a die attach film and metal layer combination, in accordance with various examples.

FIG. 1B is a cross-sectional view of the die attach film and metal layer combination 102, in accordance with various examples. As shown, in some examples, the combination 102 includes a metal layer 106 and a die attach film (DAF) 108 abutting the metal layer 106. In some examples, the metal layer 106 includes a copper layer, such as a copper foil. Other examples of the metal layer 106 include nickel, or a copper or nickel foil plated with a noble metal or metal alloy. Example thicknesses of the metal layer 106 and the DAF 108 are described below. In examples, the DAF 108 is composed of thermally conductive fillers, resins like epoxy, hardeners, and/or additives. In some examples, the DAF 108 is composed of a 2:1 ratio of resin to a diamine curing agent. The resin contains a 7:4 ratio of diglycidyl ether of bisphenol F to phenoxy resin, a greater than 80 wt. % silver particles or flake, approximately 0.5 wt. % of catalyst 1-cyanoethyl-2-ethyl-4-methylmidazole, and approximately 2 wt. % coupling agent of 3-glycidoxypropyl trimethoxysilane. In examples, phenoxy resin is dissolved in methyl ethyl ketone under heat and is then mixed with other components, degassed and then laminated on liners. In some examples, the DAF 108 may include catalysts such as 1-cyanoethyl-2-ethyl-4-methylimidazole to facilitate polymerization simultaneous to solder bump reflows and metallurgical bonding of the solder bumps to adjoining pads. Such catalysts may enable a polymer curing percentage of at least 50% during reflow, and further curing may occur during curing steps subsequent to the application of mold compound.

Figure 1C:
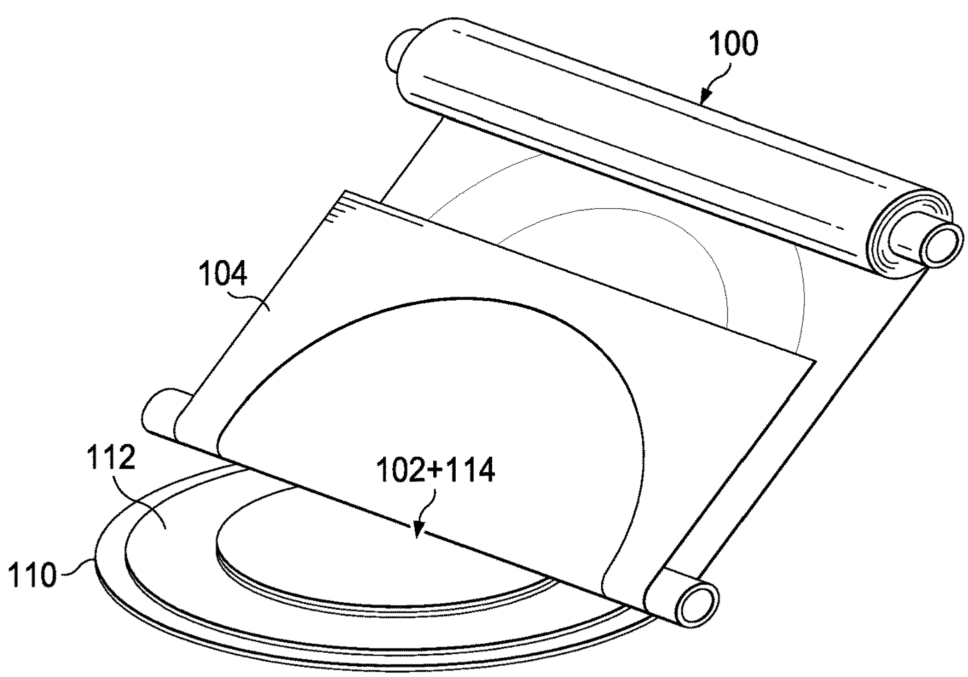
FIG. 1C is a perspective view of an application of a die attach film and metal layer combination to a semiconductor wafer, in accordance with various examples.

The die attach film and metal layer combination 102 is applied to a semiconductor wafer when the wafer is mounted on a carrier using dicing tape. FIG. 1C illustrates such an application, with the combination 102 being applied to a semiconductor wafer 114 (not expressly shown) that is positioned on a carrier 110 using dicing tape 112. In examples, and as described above, the diameters of the combination 102 and the semiconductor wafer 114 are approximately equal. In examples, the diameter of the semiconductor wafer 114 is smaller than that of the dicing tape 112. In examples, the diameter of the semiconductor wafer 114 is smaller than that of the carrier 110. The combination 102 can be adhered directly to the semiconductor wafer 114. The DAF 108 is subsequently heated to a range between 60 and 85 degrees Celsius to strengthen the adhesion between the DAF 108 and the semiconductor wafer 114, with the sheet 104 being removed by pulling it away from the semiconductor wafer 114, as shown. If the temperature is below 60 degrees Celsius, there may not be enough adhesion, and 85 degrees Celsius is the typical upper limit that can be provided by equipment today, although temperatures above 85 degrees are acceptable.

Figure 1D:
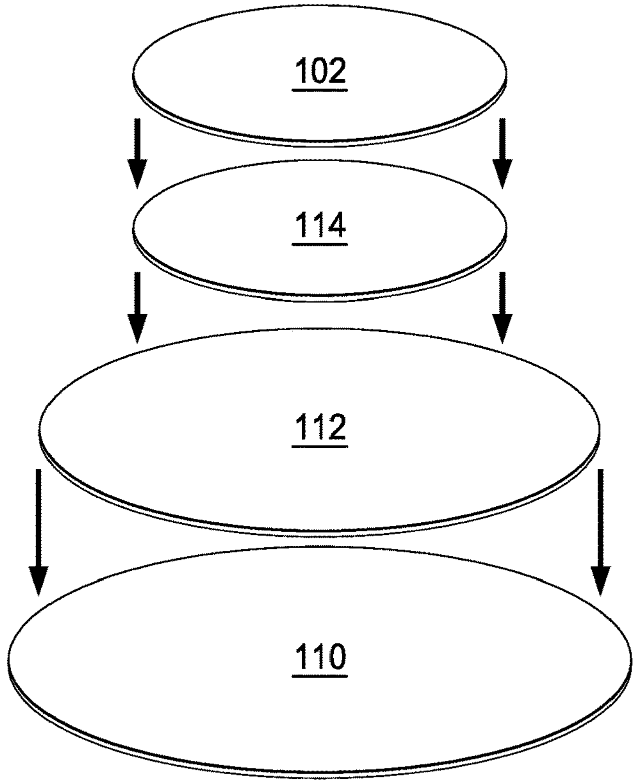
FIG. 1D is an exploded view of a semiconductor wafer stack, in accordance with various examples.

FIG. 1D is an exploded view of a semiconductor wafer stack 111 formed by the application of the combination 102 to the semiconductor wafer 114 as depicted in FIG. 1C, in accordance with various examples. The semiconductor wafer stack 111 includes the carrier 110, the dicing tape 112 abutting the carrier 110, the semiconductor wafer 114 abutting the dicing tape 112, the DAF 108 of the combination 102 abutting the semiconductor wafer 114, and the metal layer 106 of the combination 102 abutting the DAF 108. In some examples, the metal layer 106 is omitted.

Figure 1E:
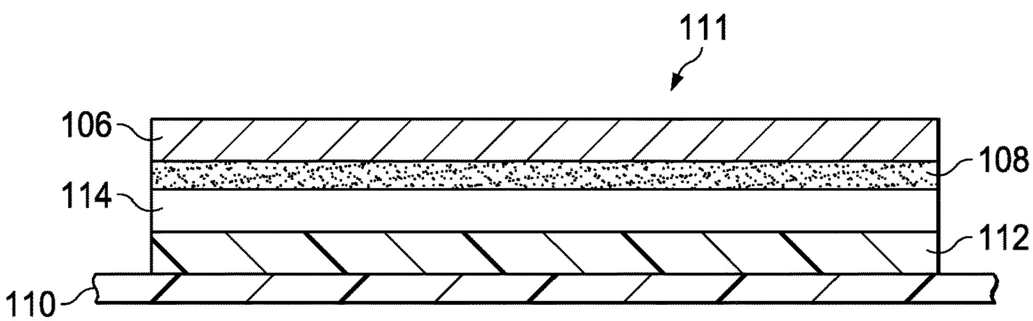
FIG. 1E is a cross-sectional view of a semiconductor wafer stack, in accordance with various examples.

FIG. 1E is a cross-sectional, assembled view of the semiconductor wafer stack 111, in accordance with various examples. As described above with reference to FIG. 1D, the semiconductor wafer stack 111 includes the carrier 110, the dicing tape 112 abutting the carrier 110, the semiconductor wafer 114 abutting the dicing tape 112, the DAF 108 abutting the semiconductor wafer 114, and the metal layer 106 abutting the DAF 108. As also described, in examples, the metal layer 106 may be omitted.

Figure 1F:
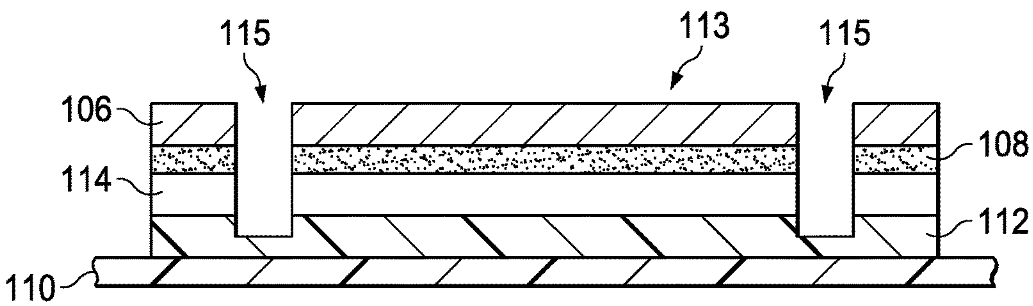
FIG. 1F is a cross-sectional view of a diced semiconductor wafer stack, in accordance with various examples.

Dicing the semiconductor wafer stack 111 produces individual semiconductor die stacks 113, an example of which is shown in FIG. 1F. Specifically, FIG. 1F depicts dicing grooves 115, which separate semiconductor die stacks 113 from each other. The dicing grooves 115 extend through the metal layer 106, the DAF 108, the semiconductor wafer 114, and part of the dicing tape 112. The dicing grooves 115 do not extend through the carrier 110. In this way, the individual semiconductor die stacks 113 may be picked and placed as appropriate, for example, as described below.

Figure 1H:
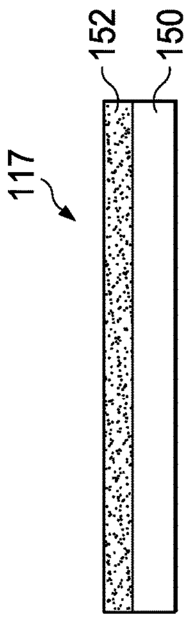
FIG. 1H is a cross-sectional view of a picked semiconductor die stack, in accordance with various examples.
Figure 1G:
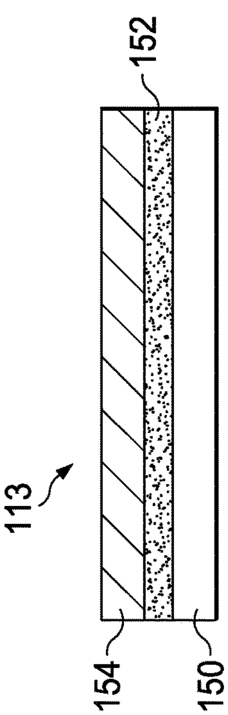
FIG. 1G is a cross-sectional view of a picked semiconductor die stack, in accordance with various examples.

Ultraviolet (UV) irradiation releases the semiconductor die from the dicing tape, producing a semiconductor die stack 113 that may be picked from the dicing tape and placed as appropriate. For example, FIG. 1G is a cross-sectional view of a picked semiconductor die stack 113, which includes a semiconductor die 150, a DAF 152 abutting the semiconductor die 150, and a metal layer 154 abutting the DAF 152. In some examples, the metal layer 154 includes a corrosion-preventing material on a surface opposite the surface that abuts the DAF 152. For instance, such a corrosion-preventing material may include a passivation layer or a noble plating layer (e.g., nickel palladium gold). The metal layer 154 may still be referred to as a metal layer if it contains a passivation layer or noble plating layer. The DAF 152 has a thermal conductivity of at least 3 watts per meter-Kelvin (w/mK). A thermal conductivity below this range is detrimental because it may not be able to dissipate heat adequately.

In some examples, the metal layer 154 is omitted from the roll 100 (FIG. 1A), but the DAF 152 is included. In such examples, the DAF 152 abuts the semiconductor die 150, but no metal layer abuts the DAF 152. FIG. 1H is a cross-sectional view of a picked semiconductor die stack 117, in accordance with various examples. The picked semiconductor die stack 117 includes the semiconductor die 150 abutting the DAF 152. In such examples, metal layers are omitted.

Figure 2A:
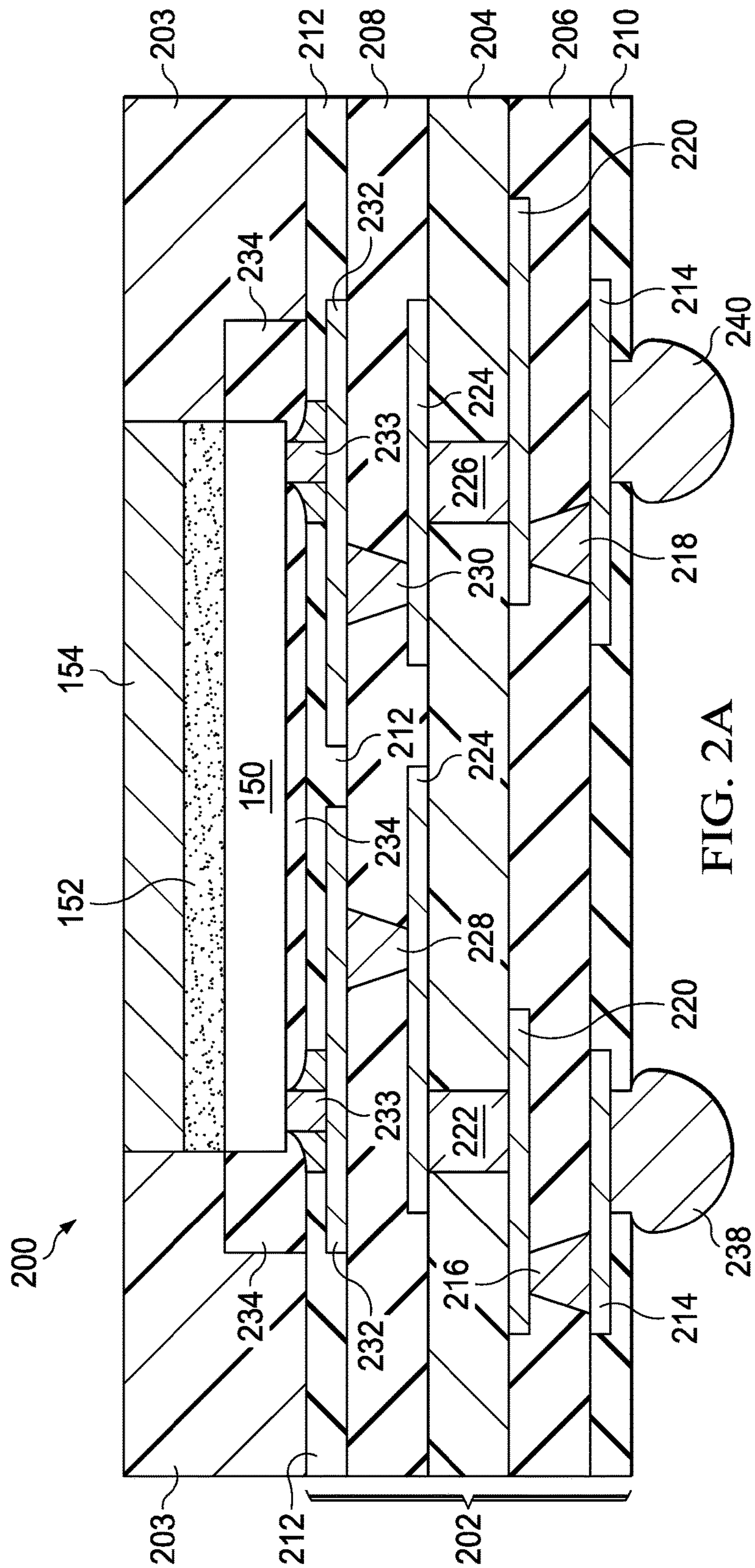
FIGS. 2A-6C are cross-sectional, top-down, and perspective views of flip-chip chip scale packages (FCCSP), in accordance with various examples.

FIGS. 2A-6C are cross-sectional, top-down, and perspective views of flip chip chip scale packages (FCCSP), in accordance with various examples. Referring to FIG. 2A, a FCCSP 200 includes a substrate 202 (the details of which are described below) and a mold compound layer 203 abutting the substrate 202. The semiconductor die 150 is coupled to the substrate 202, and the substrate 202 facilitates communications between the semiconductor die 150 and electronic device(s) on a printed circuit board upon which the FCCSP 200 is mounted. The FCCSP 200 includes the DAF 152 abutting the non-device side of the semiconductor die 150, and the FCCSP 200 further includes the metal layer 154 abutting the DAF 152. The picked semiconductor die stack 113 (FIG. 1G), including the semiconductor die 150, DAF 152, and metal layer 154, may be placed on the substrate 202 prior to application of the mold compound layer 203. The DAF 152 may be cured during solder reflow processes for the FCCSP 200, and may be further cured after application of the mold compound layer 203. Such curing processes include the application of heat in the range of 165 to 185 degrees Celsius for 3 to 24 hours. Applying a total amount of heat below this range is detrimental because the mold compound may not be fully cured and may not achieve adequate adhesion, and applying a total amount of heat above this range is detrimental because curing for too long causes warping and thus decreased manufacturing efficiency and/or productivity. The DAF 152 and the metal layer 154 promote heat dissipation from the backside of the semiconductor die 150 to an exterior of the FCCSP 200. In examples, the top surface of the metal layer 154 is approximately co-planar with the top surface of the mold compound layer 203.

The structure of the substrate 202 may vary depending on the application in which the FCCSP 200 is deployed. In the example of FIG. 2A, the substrate 202 includes a core 204, such as a fiber-reinforced resin. The substrate 202 may include a dielectric layer 206 (e.g., a pre-preg material). The substrate 202 may include a dielectric layer 208 (e.g., a pre-preg material). The substrate 202 may include solder masks 210 and 212, as well as metal layers 214, 220, 224, and 232. In examples, vias 222 and 226 extend through the core 204 to couple the metal layers 220 and 224 to each other. In examples, vias 216 and 218 extend through the dielectric layer 206 to couple the metal layers 214 and 220 to each other. In examples, vias 228 and 230 extend through the dielectric layer 208 to couple the metal layers 224 and 232 to each other. In examples, the FCCSP 200 includes conductive (e.g., copper) pillars 233 that couple the metal layer 232 to circuitry on the device side of the semiconductor die 150. In examples, the FCCSP 200 includes a capillary underfill 234 positioned between the mold compound layer 203, semiconductor die 150, solder mask 212, and conductive pillars 233. The FCCSP 200 includes solder balls 238 and 240 that facilitate coupling of the FCCSP 200 with a printed circuit board (PCB). Circuitry formed on the semiconductor die 150 communicates with other electronic device(s) on such a PCB by way of the substrate 202 and the solder balls 238 and 240. In this disclosure, the metal layers 214, 220, 224, and 232 may be referred to as conductive layers. In this disclosure, the DAF 152 and/or the metal layer 154 may be referred to as thermally conductive layers.

Figure 2B:
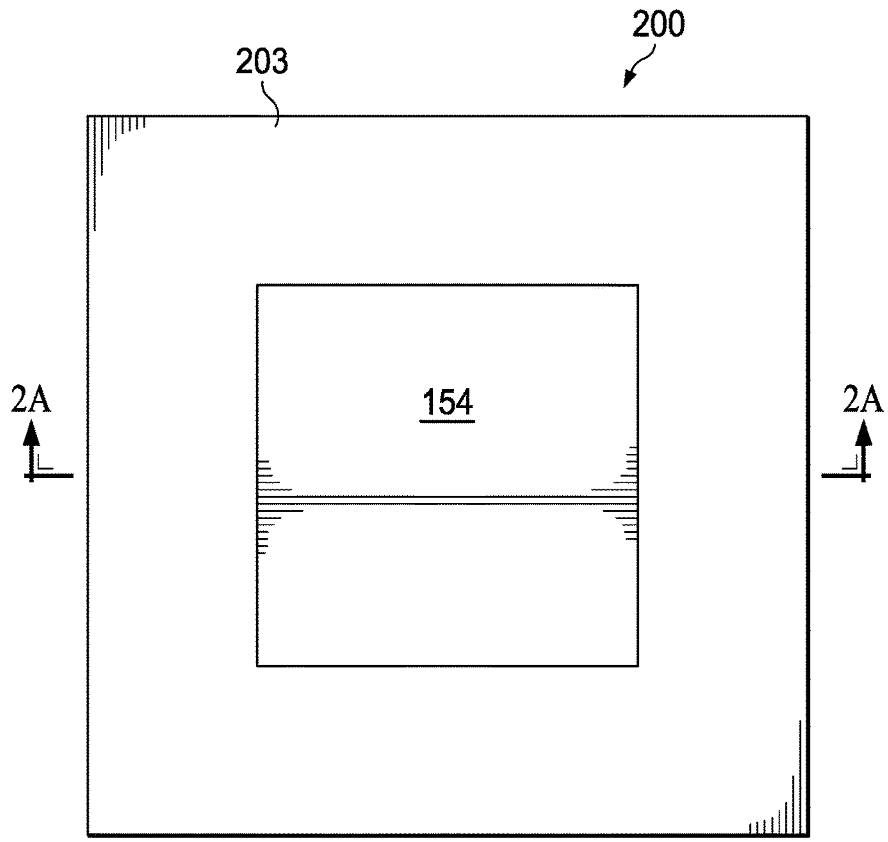
Figure 2C:
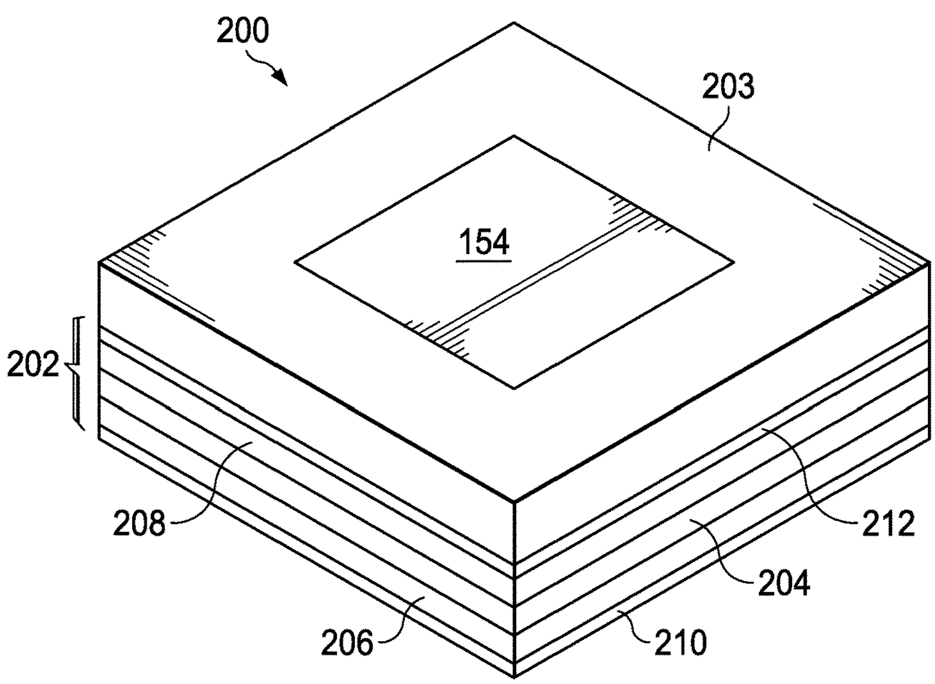

The DAF 152 has a thickness ranging between 5 and 100 microns. A thickness of the DAF 152 below this range is disadvantageous at least because of associated manufacturing challenges, and a thickness of the DAF 152 above this range is disadvantageous at least because of a substantial decrease in thermal performance. The metal layer 154 has a thickness ranging from 25 microns to 100 microns. A thickness of the metal layer 154 below this range is disadvantageous at least because of reduced heat dissipation, and a thickness of the metal layer 154 above this range is disadvantageous at least because of manufacturing difficulties during wafer dicing. FIG. 2B is a top-down view of the structure of FIG. 2A, and FIG. 2C is a perspective view of the structure of FIG. 2A.

Figure 3A:
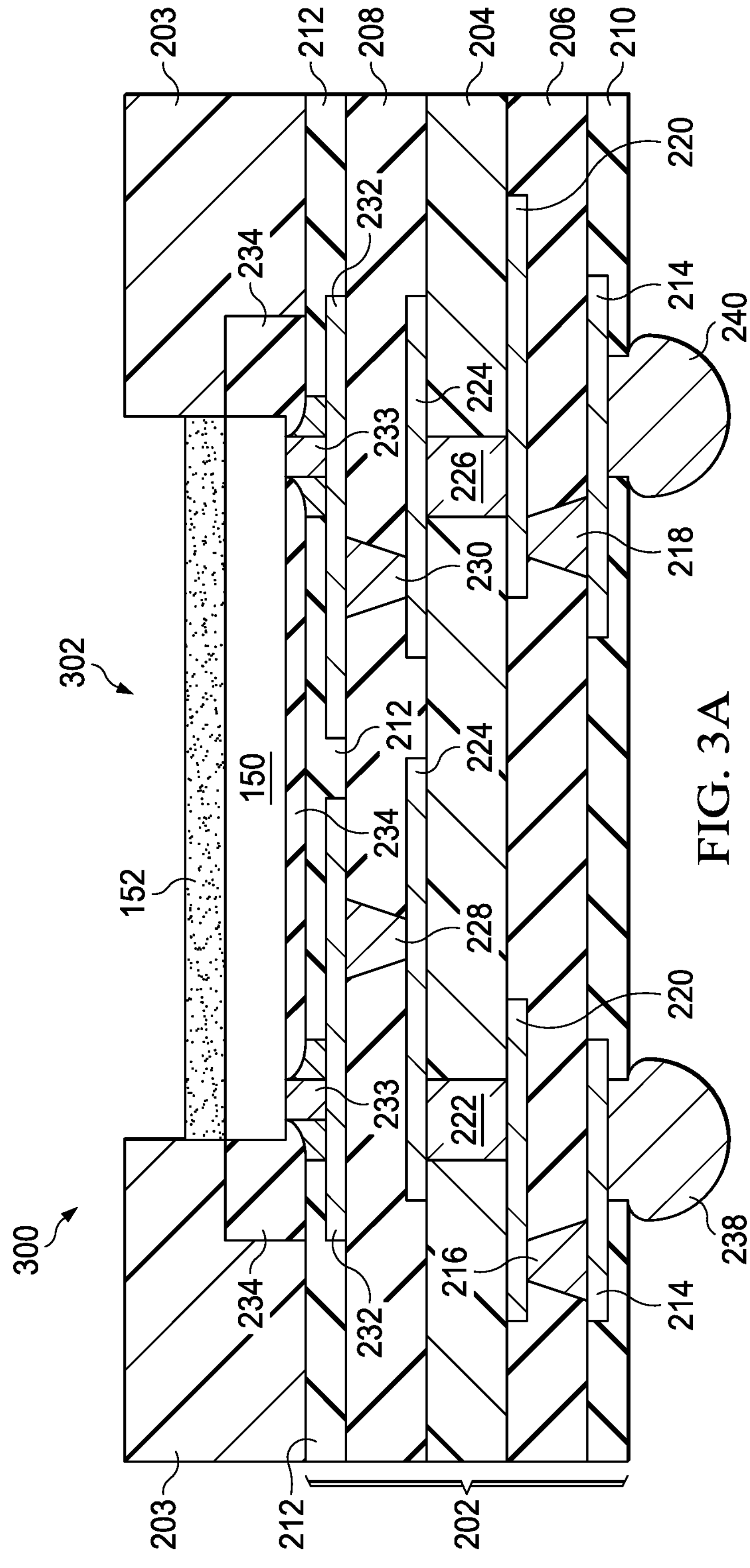
Figure 3B:
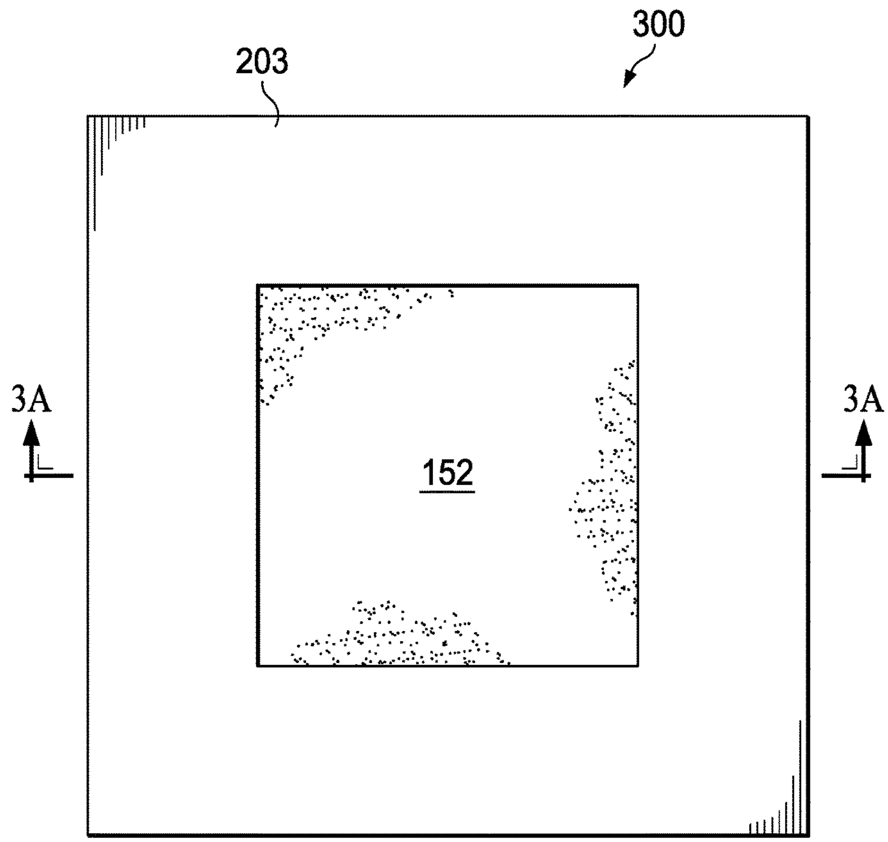
Figure 3C:
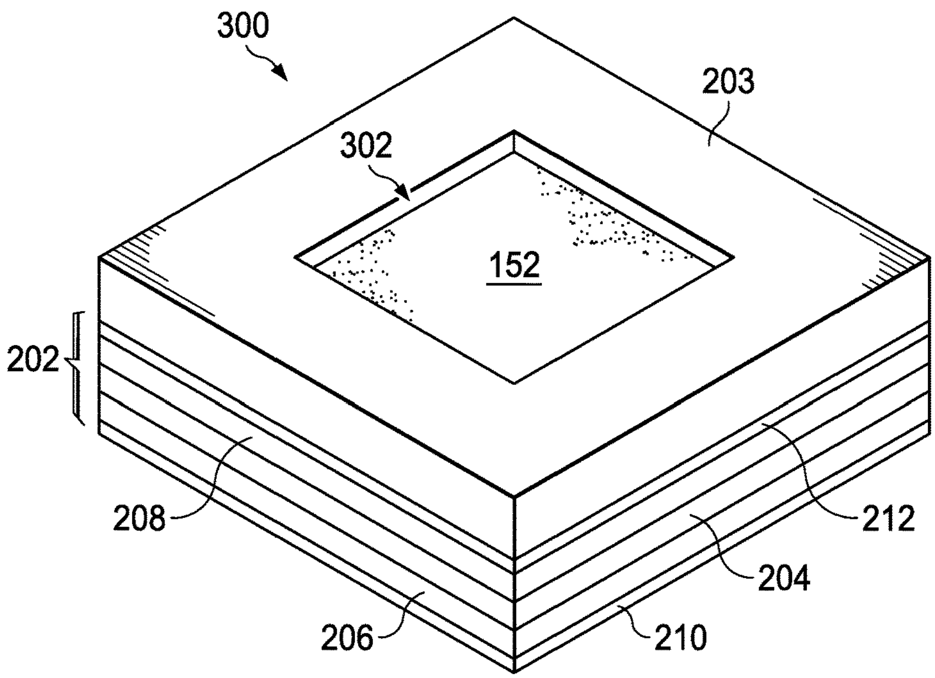

FIG. 3A shows an example FCCSP 300. The FCCSP 300 is virtually identical to the FCCSP 200, except that the FCCSP 300 omits the metal layer 154 of the FCCSP 200. In lieu of the metal layer 154, the FCCSP 300 includes a cavity 302 above the DAF 152, the dimensions of which are defined by the DAF 152 and the mold compound layer 203. In the FCCSP 300, heat from the semiconductor die 150 is dissipated via the DAF 152 and the cavity 302. The FCCSP 300 may be fabricated in a manner similar to that for the FCCSP 200, with the picked semiconductor die stack 117 (FIG. 1H) being placed on the substrate 202 and the mold compound layer 203 being subsequently applied. The DAF 152 has a thickness range as described above, with thicknesses falling outside of this range being disadvantageous for the reasons provided above. The cavity 302 has a thickness range identical to that of the metal layer 154, described above, with thicknesses falling outside of this range being disadvantageous for the reasons described above with reference to the metal layer 154. FIG. 3B is a top-down view of the structure of FIG. 3A, and FIG. 3C is a perspective view of the structure of FIG. 3A.

Figure 4A:
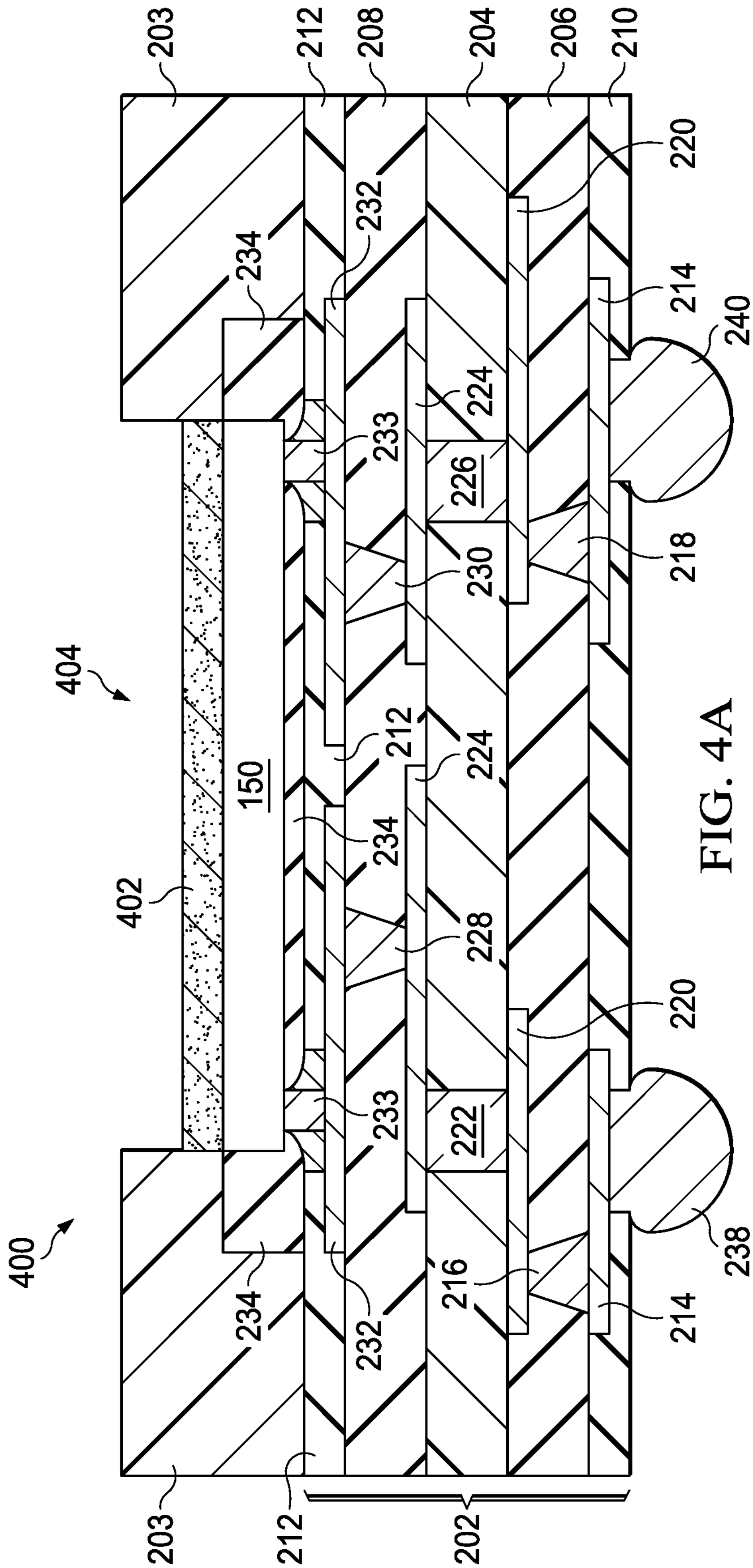

FIG. 4A shows an example FCCSP 400. The FCCSP 400 is virtually identical to the FCCSP 300, except that the FCCSP 400 replaces the DAF 152 with a thermally conductive paste 402 that abuts the back side of the semiconductor die 150 and that abuts the mold compound layer 203. In the FCCSP 400, heat from the semiconductor die 150 is dissipated via the thermally conductive paste 402. The fabrication of the FCCSP 400 may differ from the fabrication of the FCCSPs 200 and 300. Specifically, the mold compound layer 203 of the FCCSP 400 may be applied prior to application of the thermally conductive paste 402. For example, a mold chase having a top member with a protrusion that vertically aligns with the semiconductor die 150 may be used to apply the mold compound layer 203. As a result, the injected mold compound may be restricted from covering the semiconductor die 150, thereby forming a cavity 404 that is defined by the semiconductor die 150 and the mold compound layer 203. After the cavity 404 is formed, the thermally conductive paste 402 may be deposited into the cavity 404 through a screen printing process. The thermally conductive paste 402 may be in B-stage (e.g., a semi-solid) to facilitate screen printing. After thermally conductive paste 402 has been deposited into the cavity 404, the thermally conductive paste 402 may be polymerized and cured, for example during a reflow process for the solder balls 238 and 240 (which increases efficiency because it does not necessitate a separate curing step). Such a reflow process includes temperatures of 230 to 265 degrees Celsius. Using reflow temperatures below this range can cause improper solder joint formation, and using reflow temperatures above this range can cause solder bump shorting and/or increased package warping. The viscosity of the thermally conductive paste 402 is in the range of 45000-65000 centiPoise (cP) at 5 revolutions per minute (RPM) with a thixotropic index in the range of 1-2 for a screen printing process. With viscosity above this range, voiding challenges arise in the paste 402, which will decrease thermal performance. With viscosity below this range, the paste 402 may experience shrinkage and thus it becomes difficult for the top surface of the thermally conductive paste 402 to maintain horizontal coplanarity with the top surface of the mold compound layer 203. The thermally conductive paste 402 has a thermal conductivity of at least 3 w/mK, with values lower than this range being disadvantageous at least because they lead to inadequate heat dissipation.

Figure 4B:
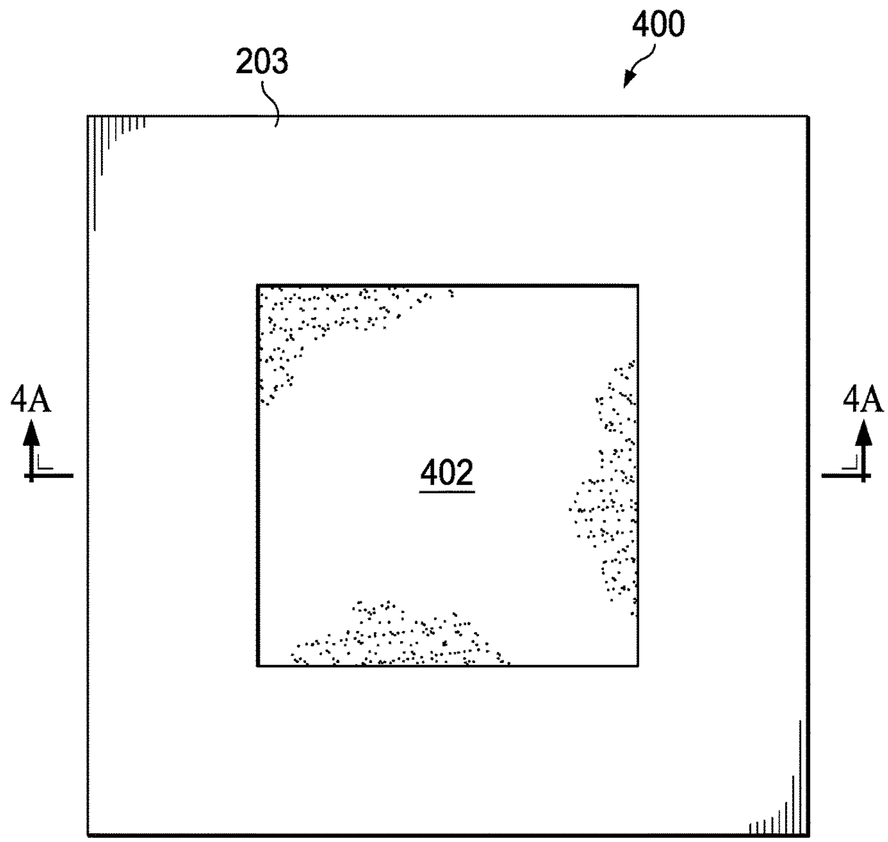
Figure 4C:
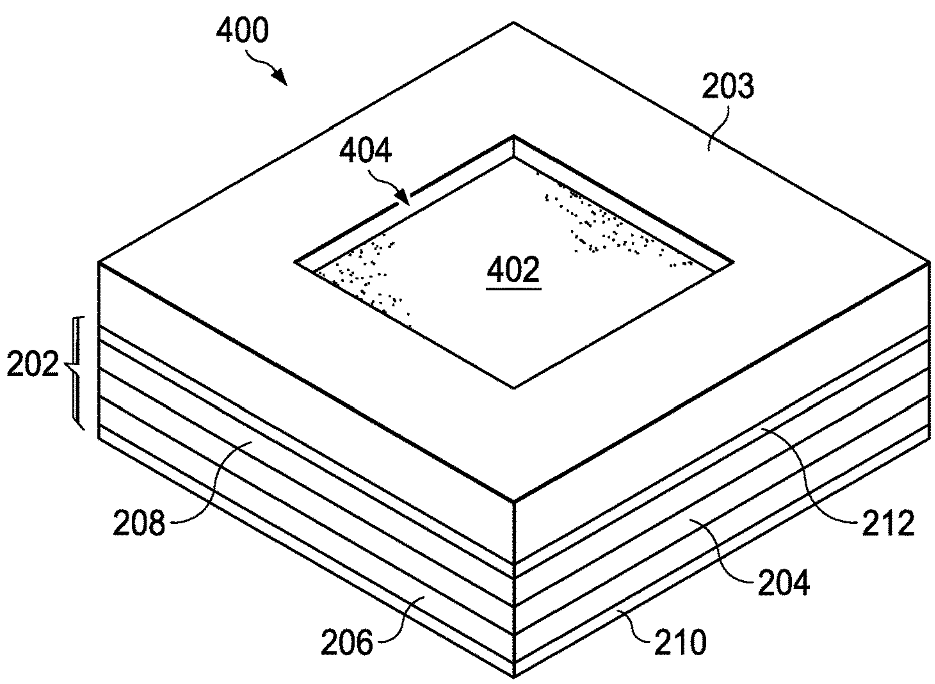

In examples, the thermally conductive paste 402 is composed of a 2:1 ratio of diglycidyl ether of bisphenol F to diamine curing agent; greater than 80 wt. % silver particles or flake, 0.5 wt. % of catalyst 1-cyanoethyl-2-ethyl-4-methylimidazole; and 2 wt. % coupling agent of 3-glycidoxypropyl trimethoxysilane. The chemicals may be mixed, degassed, and then filled into a syringe for subsequent application. The thermally conductive paste 402 has a thickness ranging from 25 to 200 microns. Thicknesses below this range are disadvantageous at least because of associated manufacturing difficulties. Thicknesses above this range are disadvantageous at least because they result in increased incidence of voiding, which decreases thermal performance. The roughness of a top surface of the thermally conductive paste 402 is determined at least in part by the pressure with which the screen printing process is performed, and at least in part by the volume of the cavity 404. FIG. 4B is a top-down view of the structure of FIG. 4A, and FIG. 4C is a perspective view of the structure of FIG. 4A.

Figure 5A:
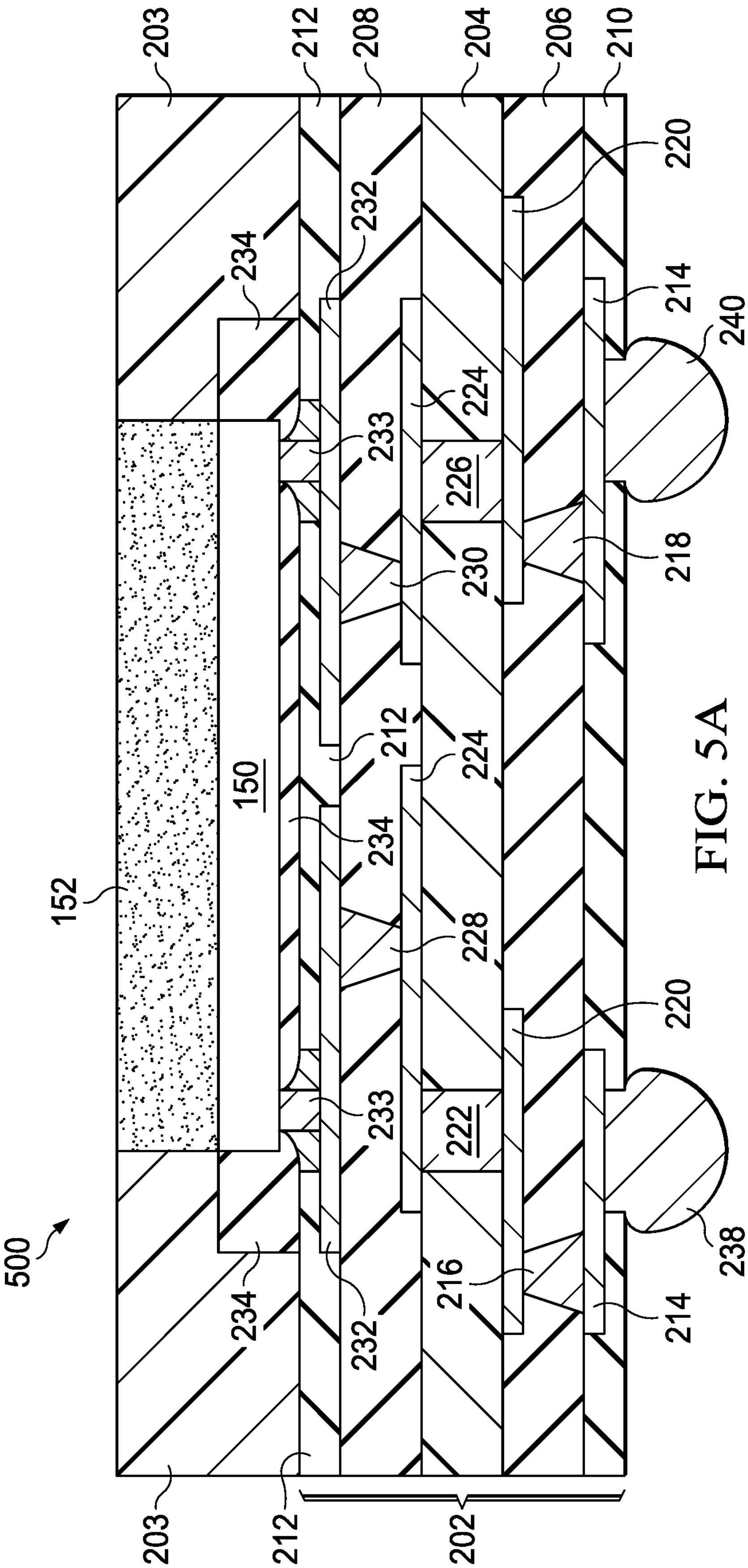
Figure 5B:
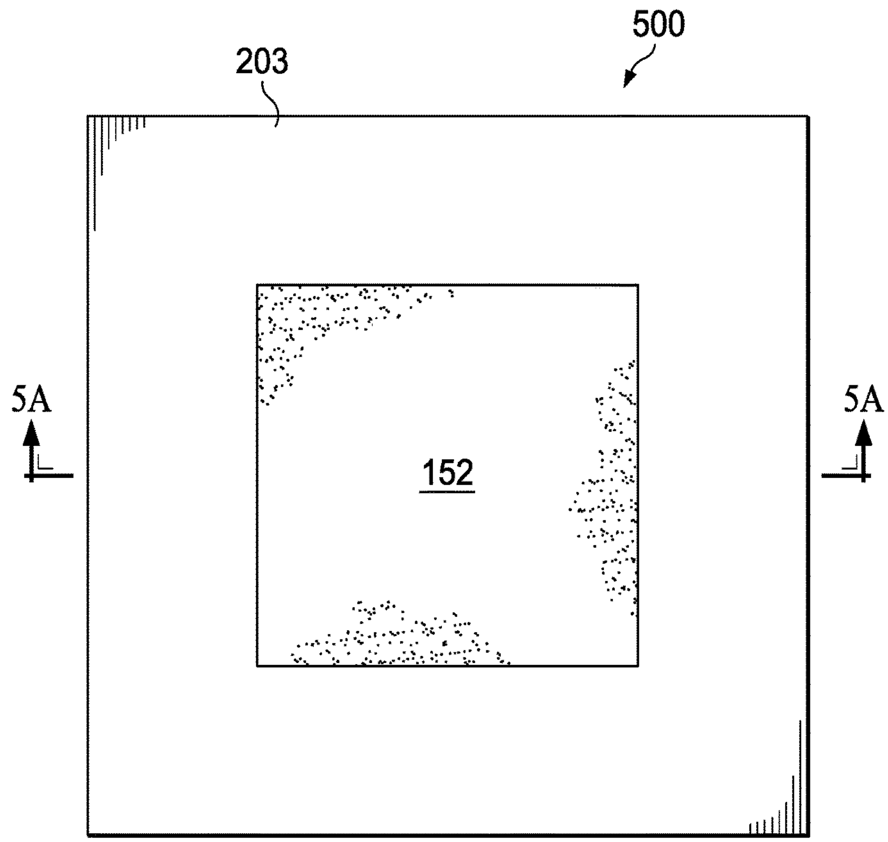
Figure 5C:
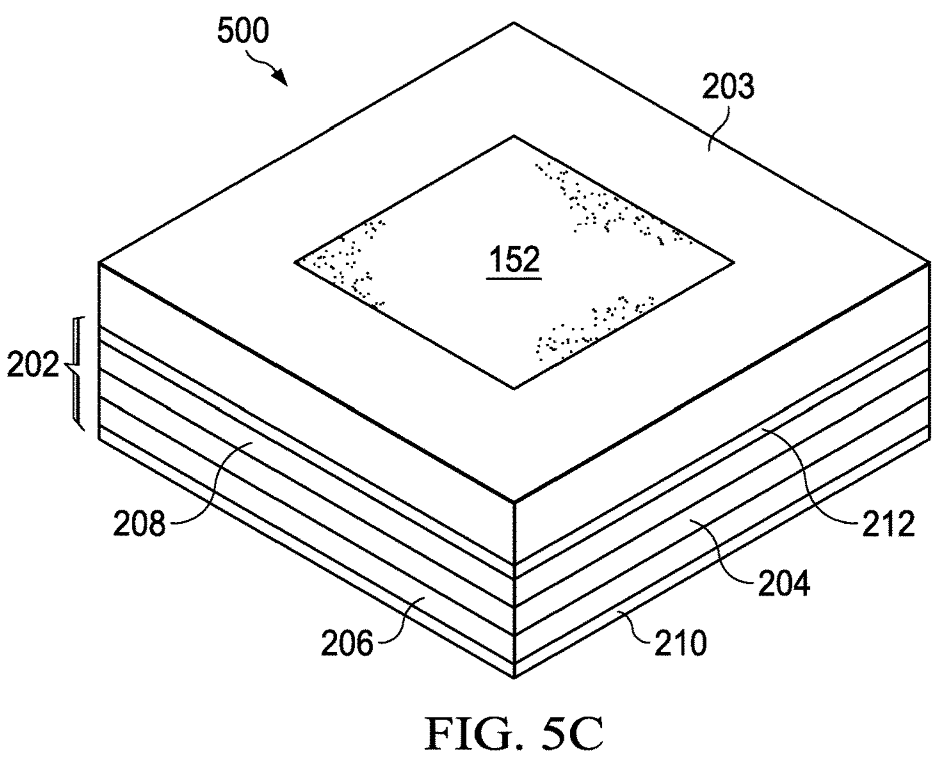

FIG. 5A shows an example FCCSP 500. The FCCSP 500 is virtually identical to the FCCSP 200, except that the FCCSP 500 omits the metal layer 154 and includes a thicker DAF 152 than the FCCSP 200. In examples, the top surface of the DAF 152 in the FCCSP 500 is approximately coplanar with the top surface of the mold compound layer 203. In the FCCSP 500, heat from the semiconductor die 150 is dissipated via the DAF 152. The FCCSP 500 may be fabricated in a manner similar to that used to fabricate the FCCSP 300. In the FCCSP 500, the thickness of the DAF 152 ranges between 5 and 100 microns, with thicknesses below this range being disadvantageous at least because of associated manufacturing difficulties, and with thicknesses above this range being disadvantageous at least because of decreases in thermal performance. FIG. 5B is a top-down view of the structure of FIG. 5A, and FIG. 5C is a perspective view of the structure of FIG. 5A.

Figure 6A:
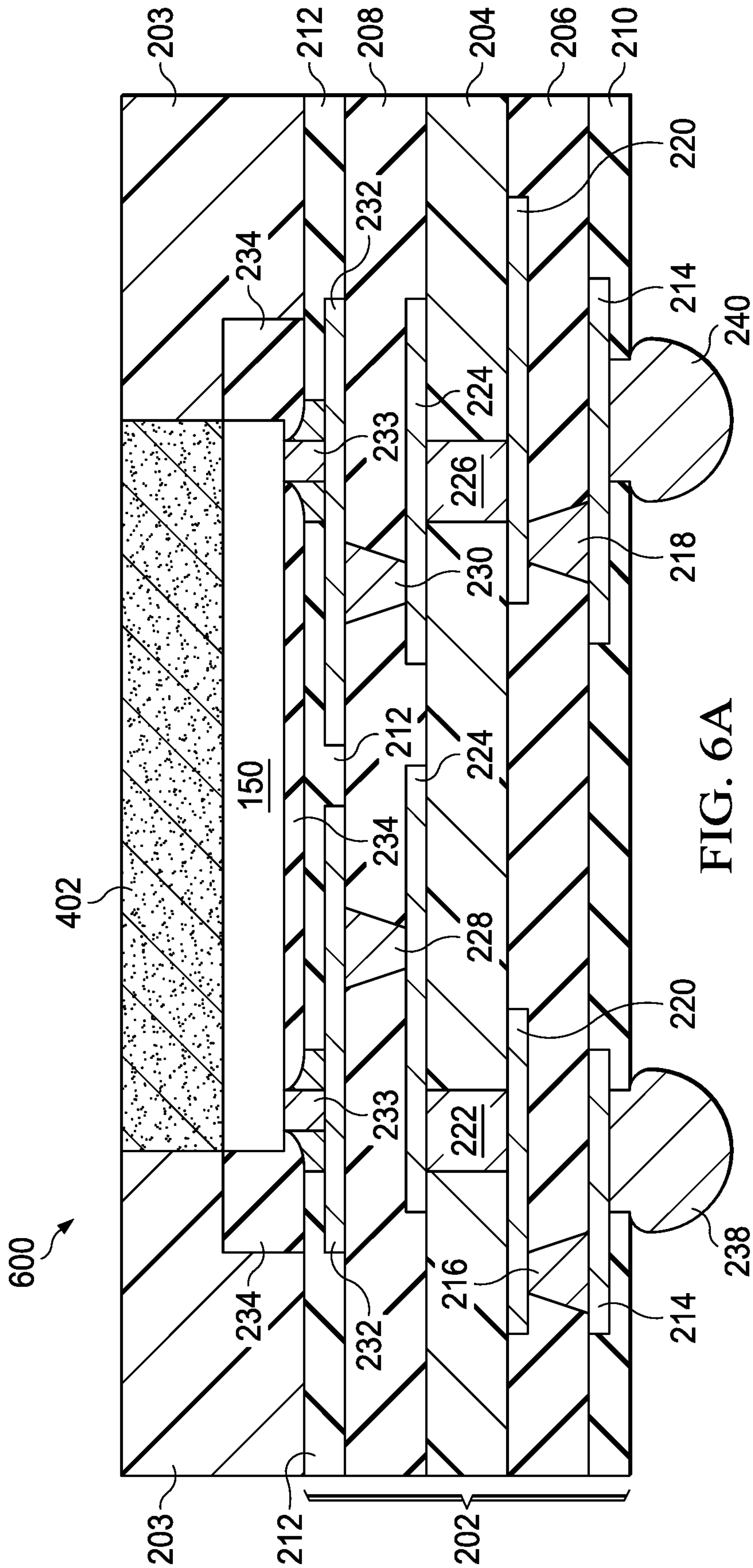
Figure 6B:
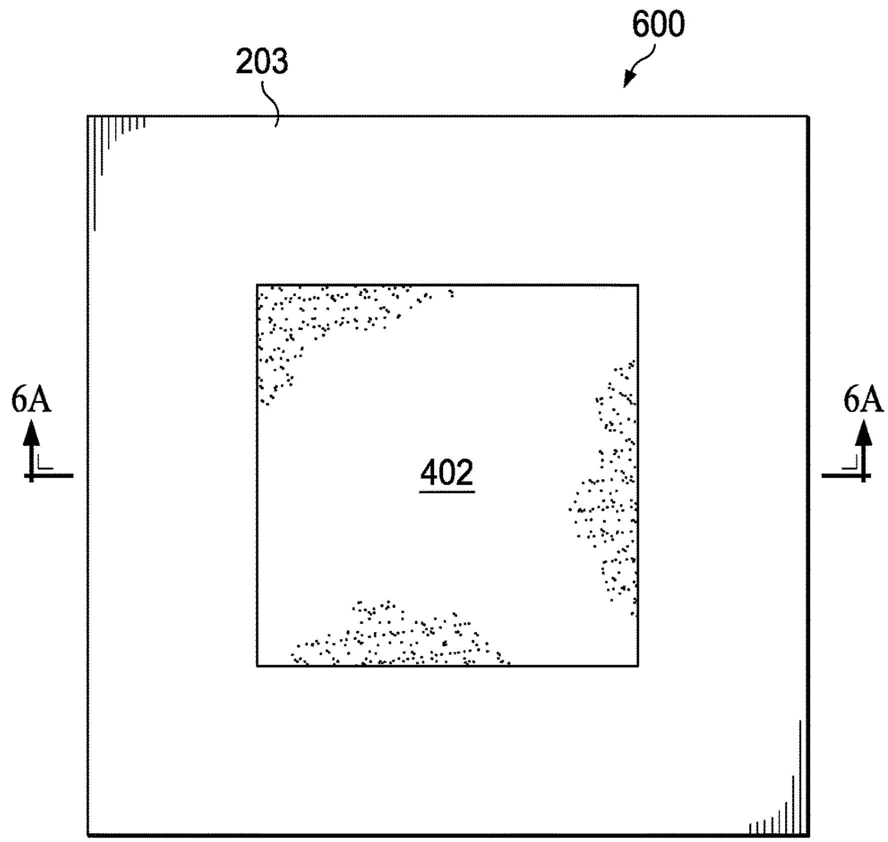
Figure 6C:
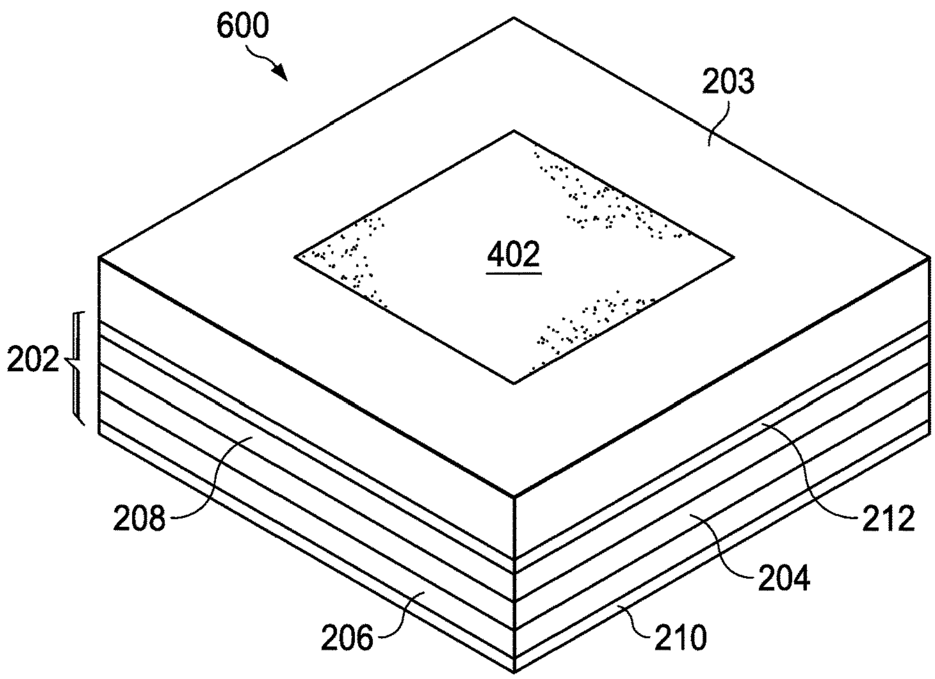

FIG. 6A shows an example FCCSP 600. The FCCSP 600 is virtually identical to the FCCSP 400, except that the FCCSP 600 includes a thicker thermally conductive paste 402 than that included in the FCCSP 400. In the FCCSP 600, heat from the semiconductor die 150 is dissipated via the thermally conductive paste 402. The FCCSP 600 may be fabricated in a manner similar to that with which the FCCSP 400 is fabricated. In the FCCSP 600, the thermally conductive paste 402 has a thickness ranging from 25 to 200 microns, with thicknesses below this range being disadvantageous at least because of associated manufacturing difficulties, and with thicknesses above this range being disadvantageous at least because of an increased incidence of voiding, which decreases thermal performance. In examples, the top surface of the thermally conductive paste 402 is approximately horizontally co-planar with the top surface of the mold compound layer 203. FIG. 6B is a top-down view of the structure of FIG. 6A, and FIG. 6C is a perspective view of the structure of FIG. 6A.

Figure 7:
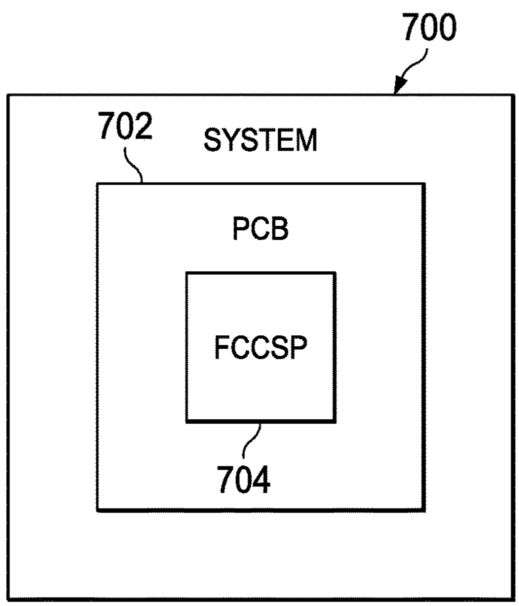
FIG. 7 is a block diagram of a system comprising a FCCSP, in accordance with various examples.

FIG. 7 is a block diagram of a system 700 in accordance with various examples. Examples of the system 700 may include applications such as personal electronics (e.g., smartphones, laptop computers, desktop computers, tablets, notebooks, artificial intelligence assistants), appliances (e.g., refrigerators, microwave ovens, toaster ovens, dishwashers), networking or enterprise-level electronics (e.g., servers, routers, modems, mainframe computers, wireless access points), automobiles and aviation (e.g., control panels, entertainment devices, navigation devices, power electronics), and numerous other electronic systems. The system 700 includes a PCB 702 upon which any number of semiconductor packages, passive components, metal traces, etc. may be positioned, including an FCCSP 704. The FCCSP 704 is representative of any of the FCCSPs described herein, such as the FCCSPs 200, 300, 400, 500, and/or 600.

Figure 8:
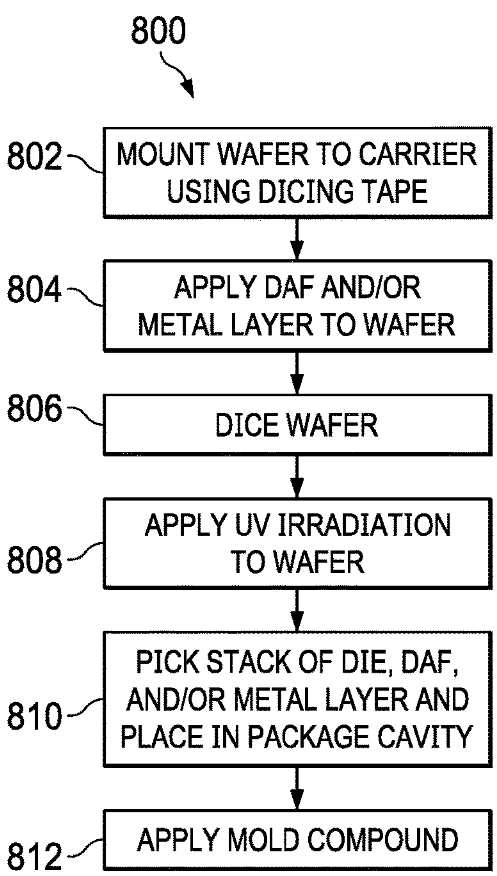
FIGS. 8 and 9 are flow diagrams of methods for manufacturing FCCSPs, in accordance with various examples.

FIG. 8 is a flow diagram of a method 800 for manufacturing FCCSPs, in accordance with various examples. The method 800 includes mounting a semiconductor wafer to a carrier using dicing tape (802). For example, the semiconductor wafer 114 may be mounted on the carrier 110 using the dicing tape 112 (FIG. 1D). The method 800 includes applying a DAF and/or a metal layer to the semiconductor wafer (804). For example, the DAF may include the DAF 152, and the metal layer may include the metal layer 154, both of which are described above. The method 800 may include dicing the semiconductor wafer (806) and applying UV irradiation to the semiconductor wafer to release the semiconductor wafer from the dicing tape (808). The method 800 may include picking the stack containing the semiconductor die, DAF, and/or metal layer and placing the semiconductor die stack on conductive pillars and a substrate (810), such as the conductive pillars 233 and substrate 202 (FIG. 2A), and a reflow process may be performed as appropriate. The method 800 may include applying a mold compound layer to the semiconductor die stack and substrate (812), such as the mold compound layer 203 (FIG. 2A).

Figure 9:
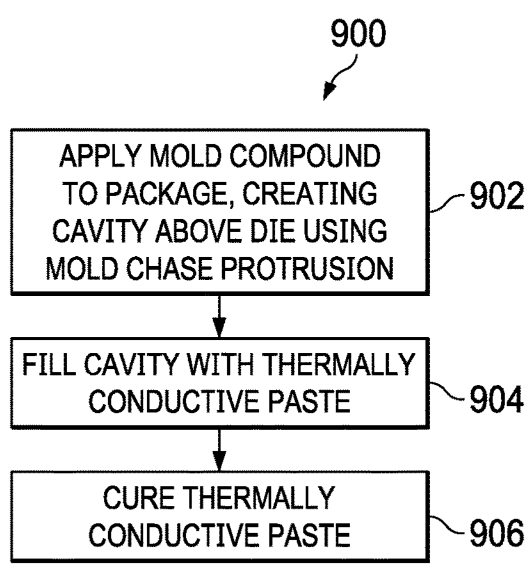

FIG. 9 is a flow diagram of a method 900 for manufacturing FCCSPs, in accordance with various examples. The method 900 includes applying a mold compound to a package using a mold chase having a top member with a protrusion, thereby creating a cavity (e.g., cavity 302 in FIG. 3A) above a semiconductor die (902). The method 900 includes filling the cavity with thermally conductive paste, such as thermally conductive paste 402 (904). The method 900 includes curing the thermally conductive paste (906).

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Unless otherwise stated, "about," "approximately," or "substantially" preceding a value means+/−10 percent of the stated value. Modifications are possible in the described examples, and other examples are possible within the scope of the claims.

What is claimed is:

1. A semiconductor package, comprising:
- a substrate including a conductive layer;
- a conductive pillar coupled to the conductive layer;
- a semiconductor die having first and second opposing surfaces, the first surface coupled to the conductive pillar;
- a die attach film abutting the second surface of the semiconductor die, a surface of the die attach film exposed from the semiconductor package; and
- a mold compound layer physically contacting the die attach film, and the substrate, wherein a plane along a top surface of the mold compound layer, a plane along the surface of the die attach film are non-coplanar, and the mold compound layer includes a cavity between the plane along the top surface of the mold compound layer and the plane along the surface of the die attach film, wherein the die attach film includes a 2:1 ratio of resin to a diamine curing agent, and wherein the resin includes a 7:4 ratio of diglycidyl ether of bisphenol F to phenoxy resin; a greater than 80 wt. % silver particles or flake; approximately 0.5 wt. % of 1-cyanoethyl-2-ethyl-4-methylmidazole; and approximately 2 wt. % 3-glycidoxypropyl trimethoxysilane.

2. The package of claim 1, wherein the die attach film includes thermally conductive fillers, resins, and hardeners.

3. A system, comprising:
- a flip-chip chip scale package (FCCSP) adapted to be coupled to a printed circuit board by way of a solder ball, the FCCSP including:
- a first conductive layer coupled to the solder ball;
- a second conductive layer coupled to the first conductive layer;
- a conductive pillar coupled to the second conductive layer;
- a semiconductor die having first and second surfaces, the first surface of the semiconductor die coupled to the conductive pillar, the second surface of the semiconductor die facing away from the conductive pillar; and
- a polymerized and cured thermally conductive paste abutting the second surface of the semiconductor die and having a surface facing away from the semiconductor die, wherein a roughness of the surface of the thermally conductive paste is based on a pressure with which the thermally conductive paste is applied to the second surface of the semiconductor die, wherein the thermally conductive paste has a thickness ranging from 25 to 200 microns.

4. The system of claim 3, wherein the thermally conductive paste includes a 2:1 ratio of diglycidyl ether of bisphenol F to diamine curing agent; greater than 80 wt. % silver particles or flake; 0.5 wt. % of 1-cyanoethyl-2-ethyl-4-methylimidazole; and 2 wt. % of 3-glycidoxypropyl trimethoxysilane.

5. The system of claim 3, further comprising a mold compound layer abutting a second surface of the thermally conductive paste.

6. The system of claim 5, wherein the surface of the thermally conductive paste is approximately co-planar with a surface of the mold compound layer, the surface of the mold compound layer exposed to an exterior of the FCCSP.

7. The system of claim 3, wherein the roughness of the surface of the thermally conductive paste is based on a volume of a cavity in which the thermally conductive paste is positioned.

8. The system of claim 3, wherein the surface of the thermally conductive paste is exposed to an exterior of the FCCSP.

9. The system of claim 3, further comprising a metal layer abutting the surface of the thermally conductive paste.

10. The system of claim 9, further comprising a passivation layer abutting the metal layer.

11. The system of claim 9, further comprising a nickel palladium gold plating layer abutting the metal layer.

* * * * *